(12) United States Patent
Waletzki (10) Patent No.: US 6,191,710 B1
(45) Date of Patent: Feb. 20, 2001

(54) DATA COMPRESSION AND DECOMPRESSION METHOD AND SYSTEM FOR DATA COMPRESSION AND DECOMPRESSION

(75) Inventor: Kenneth R. Waletzki, Olympia, WA (US)

(73) Assignee: Intel Corp., Santa Clara, CA (US)

( * ) Notice: Under 35 U.S.C. 154(b), the term of this patent shall be extended for 0 days.

(21) Appl. No.: 09/222,956

(22) Filed: Dec. 30, 1998

(51) Int. Cl.[7] .................................................. H03M 7/46
(52) U.S. Cl. ...................................... 341/63; 341/87
(58) Field of Search ................................. 341/63, 87

(56) References Cited

U.S. PATENT DOCUMENTS 3,980,809 * 9/1976 Cook .................................. 341/63
5,491,481 * 2/1996 Akagiri .............................. 341/87
5,877,714 * 3/1999 Satoh ................................ 341/87

* cited by examiner

Primary Examiner—Trong Phan
(74) Attorney, Agent, or Firm—Antonelli, Terry, Stout & Kraus, LLP.

(57) ABSTRACT

A system for compressing and decompressing a data pattern of data bits, so as to obtain a highly compressed data record. In accordance with embodiments of the invention, a group of candidate numbers is provided with each number comprising a sequence of statistically random bits. Bits of a subject data pattern are compared with bits of each candidate of the group of numbers to find a largest sequence of bits of the subject data pattern which match a sequence of bits within any one of the group of candidate numbers. Stored are all of: the data pattern except the matched bits, information designating the candidate number providing a largest matching sequence of bits, locations of the matched bits in the subject data pattern and in the candidate number, and a number encoding a number of the matched bits.

27 Claims, 4 Drawing Sheets

FIG. 7

DATA COMPRESSION AND DECOMPRESSION METHOD AND SYSTEM FOR DATA COMPRESSION AND DECOMPRESSION

FIELD

The present invention relates to data compression and decompression methods and systems for data compression and decompression.

BACKGROUND

Numerous data compression algorithms exist which have the objective of reducing the volume of data in a data record to lessen storage requirements and/or data transmission volume. More particularly, such algorithms minimize the volume of compressed data, while permitting a later complete reproduction of the original data record. An example of such a data compression algorithm is the Lemple-Ziv method. Obtaining the highest degree of data compression is desirable and advantageous in many applications requiring data compression.

SUMMARY

The invention is directed to a process for compressing a subject data pattern of data bits with a data processing system, including: providing a group of candidate numbers with each number comprising a sequence of bits; comparing with the data processing system, the subject data pattern with at least some portions of the group of candidate numbers to match a sequence of bits of the subject data pattern and a largest sequence of bits within the compared portions of the group of candidate numbers; and, storing all of the data pattern except the matched bits, and information identifying the matched bits within the group of candidate numbers.

BRIEF DESCRIPTION OF DRAWINGS

The foregoing and a better understanding of the present invention will become apparent from the following detailed description of exemplary embodiments and the claims when read in connection with the accompanying drawings, all forming a part of the disclosure hereof this invention. While the foregoing and following written and illustrated disclosure focuses on disclosing example embodiments of the invention, it should be clearly understood that the same is by way of illustration and example only and is not to be taken by way of limitation, the spirit and scope of the present invention being limited only by the terms of the appended claims.

The following represents brief descriptions of the drawings, wherein.

DETAILED DESCRIPTION

Before beginning a detailed description of various example embodiments of the subject invention, mention of the following is in order. When appropriate, like reference numerals and characters are used to designate identical, corresponding or similar components in differing FIG. drawings. To aid in an understanding of the present invention, discussion turns first to an example processing embodiment of the present invention, and thereafter turns to further general discussions of embodiments of the invention. The present invention is no way limited to this specific example. Further, while the example discusses specific "random numbers" and a "random number table", embodiments of the present invention are more broadly directed to "candidate data patterns" and "candidate data pattern tables" as discussed later in the general discussions of embodiments of the invention. The term "subject data pattern" as used herein, means a data pattern which is currently undergoing compression or decompression processing. The result of a particular compression or decompression stage may itself become a "subject data pattern" in a next or subsequent compression or decompression stage.

Figure 1:
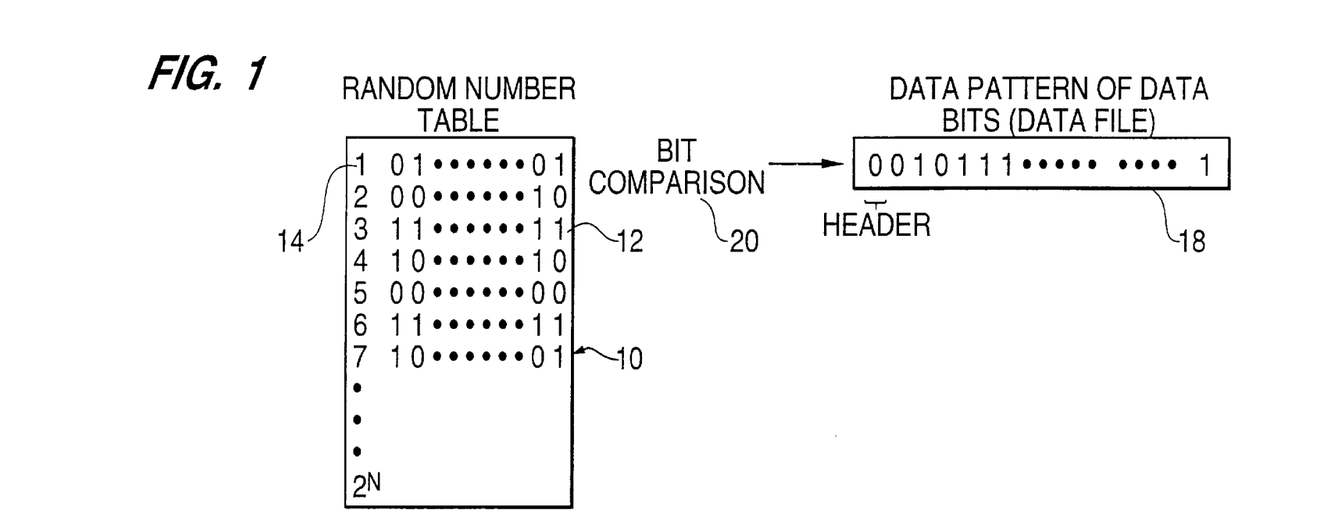
FIG. 1 is a diagram of an example initial process of the present invention.

Turning now to the example, FIG. 1 illustrates an example initial processing of an embodiment of the present invention. A table 10 of statistically individual random or pseudo random numbers 12 (hereinafter, generically called "random numbers") is generated by any well-known algorithm, for example, the random numbers may be auto-generated polynomials. Each individual number 12 is identified by its number address 14 in the table 10. The number addresses in the table ascend in order to a last number which may be, without limitation, a power of 2 raised to an integer power N, such as $2^{16}$. The bits of each random number 12 (partially illustrated using multiple dots) are intended to be symbolic of a large number of bits which may be hundreds or thousands of bits in length. Having a large number of bits in each number 12 is desirable because greater degrees of data compression, as explained below, are obtained by matching the largest number of sequential bits in any of the individual random numbers 12 from the random number table 10 with a sequential pattern of bits in the subject data pattern 18.

The starting subject data pattern may have a header, and the initial data bit of the header may be a predetermined compression indicator bit used to indicate whether the subject data pattern is an uncompressed or compressed subject data pattern, e.g., a first logical value (e.g., zero) may be used within such indicator bit to encode that the data pattern is a uncompressed (i.e., raw) data pattern, while an opposite logical value (e.g., one) may be used within such indicator bit to encode that the data pattern is a compressed data pattern. In the case of this starting, uncompressed data pattern, the compression indicator bit is the first logical value (e.g., zero). The subject data pattern of data bits 18 may be any type of data file, including, but not limited to, an audio or a video record which has been digitized. The subject data pattern 18 typically contains many millions of bits of data which would require substantial storage space if not compressed, and may not be able to be stored even with the massive storage provided with compact disk (CD) or digital video disk (DVD) technology, unless compressed.

The initial step of this example process/embodiment of the invention is a bit comparison 20 between each of the individual random numbers 12 of the random number table 10, to identify the particular random number in the random number table having the largest number of sequential candidate bits which are matched with sequential bits within the subject data pattern 18. This matching process may be performed with any conventional matching process.

Figure 2:
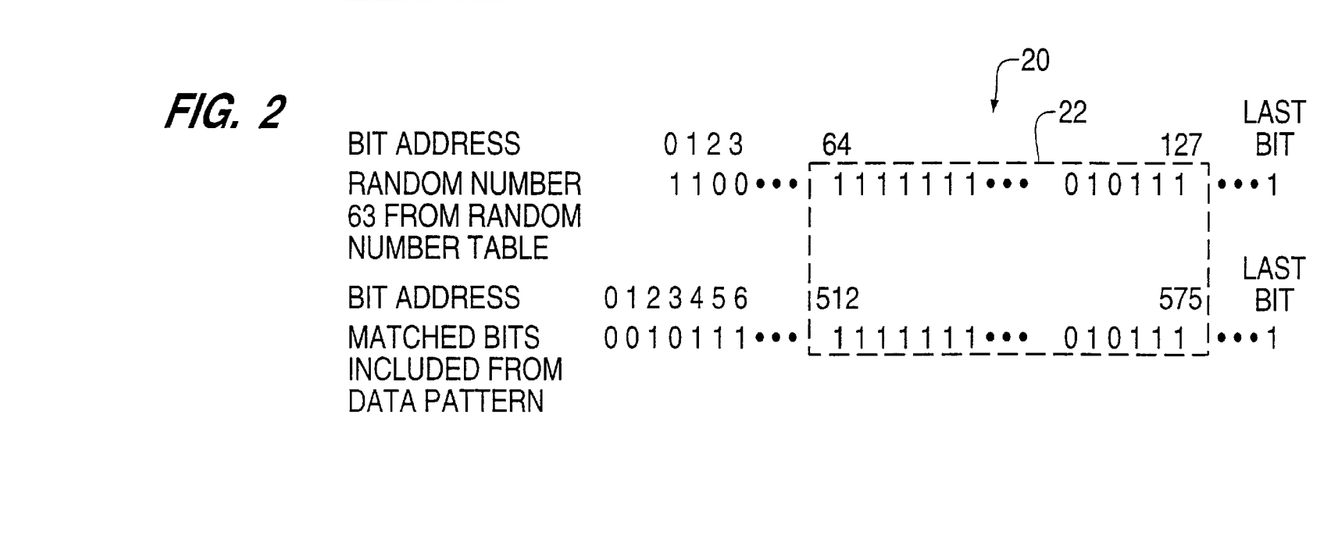
FIG. 2 illustrates an example of matching of bits in a data pattern of data bits with a random number within the random number table of FIG. 1 having the highest number of common bits.

FIG. 2 illustrates the results of the initial bit comparison 20 of FIG. 1, i.e., after a particular random number having the largest number of sequential matched bits in the data pattern 18 has been identified. The FIG. 2 upper information represents the candidate random number, while the FIG. 2 lower information represents the subject data pattern. In this example, the identified (i.e., maximally-matched) random number is random number 63 from the random number table 10, i.e., the random number 63 contains the largest number of sequential candidate bits which match sequential subject bits in the subject data pattern 18. The top rows of numbers designated by BIT ADDRESS contain the number addresses of respective bits, while the rows immediately below the BIT ADDRESS rows contain corresponding bit values of the random number and the subject data pattern. The dashed rectangular box 22 signifies that candidate bits 64 through 127 in random number 63 have been matched with subject bits 512 through 575 of the matched subject data pattern 18. Those bits outside of the rectangular box 22 in the random number 63 and in the data pattern 18, are not matched bits.

Data compression is obtained by discarding the matched bits, namely those bits appearing at addresses 512–575 in the data pattern and replacing them with sufficient identifying information permitting the data pattern to be reconstituted exactly during decompression. One consideration within embodiments of the present invention for improved data compression, is that the number of information bits used to encode information with respect to the deletion of bits (e.g., bits 512–575) should be fewer in number than the number of discarded bits, which, in this particular example, is 64 bits.

Figure 3:
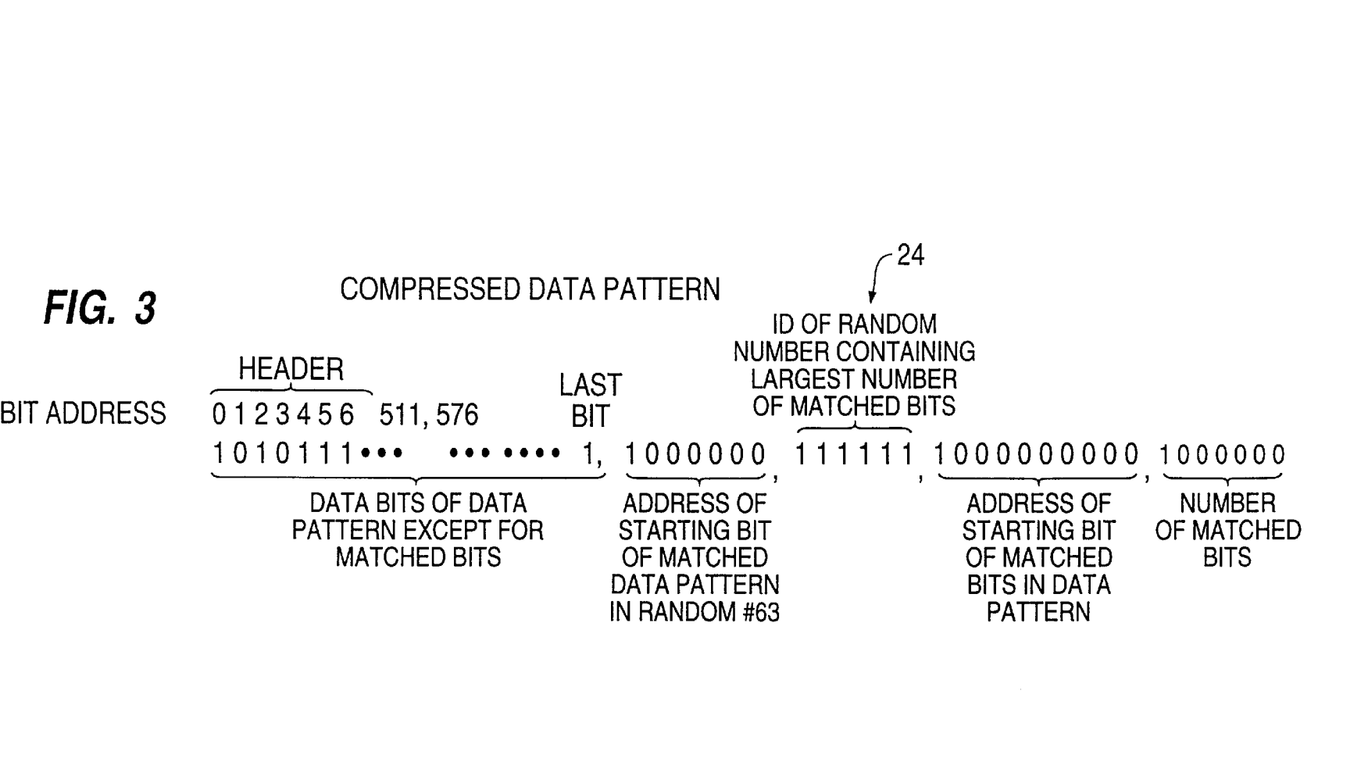
FIG. 3 illustrates an example storage field of the compressed data pattern resultant from the matching operation of FIG. 2.

FIG. 3 represents an example form of a resultant (i.e., encoded and compressed) subject data pattern 24 resultant from the comparison process of FIG. 2, in which the data bits at addresses 512–575 have been discarded and replaced with addressing information and other information permitting the discarded bits to be reconstituted to reform the original data pattern 18 during decompression. The data pattern 24 contains all of the bits of the original data pattern 18 which have not been matched (i.e., all but bits 512–575), plus additional information. The initial or compression indicator bit has been changed to a "one" value which signifies that the data pattern is not all pure data, i.e., is a compressed subject data pattern. A predetermined number of trailing or footer bits may be added and divided into predetermined fields for providing decompression information. Alternatively, the initial compression indicator bit of the header may be followed by a predetermined number of length indicator bits to encode where the total length of the pure data record ends, and where the addressing and other decompression information begins.

With respect to the present example, in place of the deleted data bits, namely bits 512–575, four additional types of addressing information are included in the decompression information 24, which information permits the deleted bits to be exactly reconstituted upon data decompression (reproduction) without error. As mentioned above, needed is some type of predefined method/format for identifying the decompression information 24 and the separate fields therein. The FIGS. 3–6 example embodiment have a predetermined number of trailing or footer bits added, and divided into predetermined fields for providing decompression information. For simplicity and clarity, the FIGS. 3–6 are illustrated with fields having changing lengths, although the use of a fixed number of bits per addressing field is the simplest way to permit identification of the individual fields. If a variable number of bits are used within the fields, then some other type of predefined method/format for identifying the separate fields must be used. For convenience and clarity, the FIGS. 3–6 decompression information 24 and separate fields therein are shown separated by commas and/or spaces, although practice of the present embodiment of the present invention in no way requires use of such specific separators.

Turning now to discussion of example fields, a first type of information (i.e., field) is a binary pattern 1000000 encoding the starting bit address of the longest matched sequential bit string in the matched random number table, i.e., in the present example, starting bit address 64 of the random number 63 from the random number table 10 illustrated in FIG. 2. The second type of information (i.e., field) is the identification of the random number from the random number table containing the largest number of matched sequential bits, i.e., number 63, which is encoded as the binary pattern 111111. The third type of information (i.e., field) is the starting bit address of the matched bits in the subject data pattern, i.e., starting bit address 512, which is encoded as the binary pattern 1000000000. The fourth type of information (i.e., field) is the number of matched bits, i.e., 64 matched bits, which is encoded as 1000000.

Figure 4:
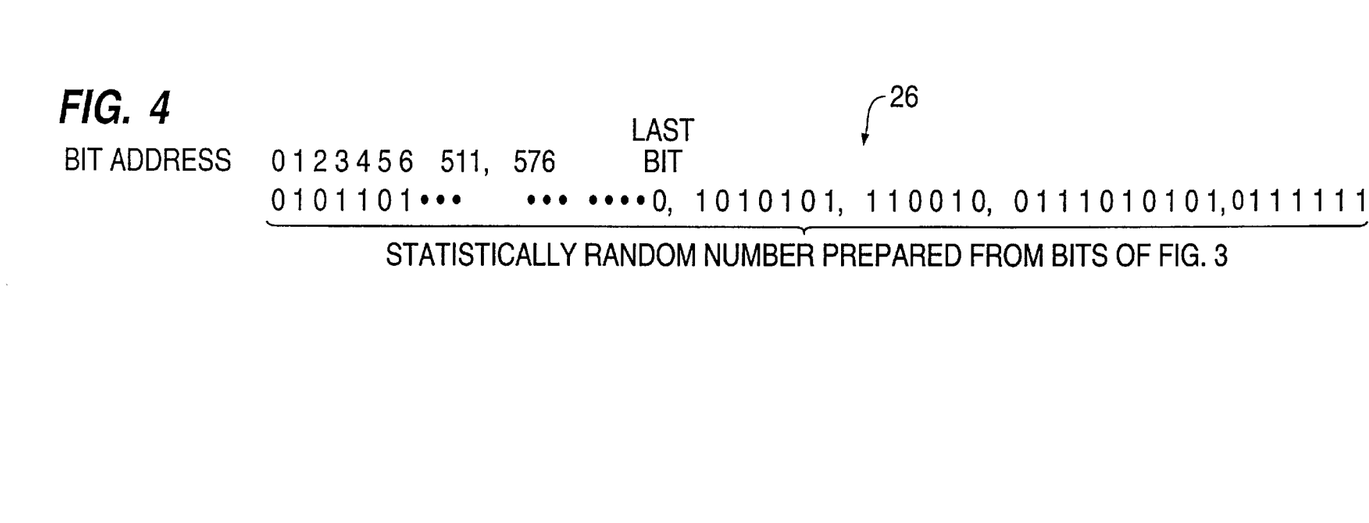
FIG. 4 illustrates an example result of processing of the compressed data pattern of FIG. 3 to generate a random number.

FIG. 4 illustrates an example subsequent data processing, i.e., transformation or modification (hereinafter, generically called "transformation" or "transform"), which iteratively may occur after the initial data compression of the original data pattern. In FIG. 4, the FIG. 3 data pattern has been processed with a conventional random number generating algorithm, so as to produce a statistically random data pattern, including transformation (e.g., randomization) being applied to all field bits. One (although not limiting) example algorithm of how to generate the FIG. 4 random number from the FIG. 3 bit pattern is to EXCLUSIVE OR the individual bits of the FIG. 3 bit pattern with a one or zero bit. The reason that it may be useful to transform from the data pattern of FIG. 3 is that, in order to obtain additional data compression, the FIG. 4 transformed data pattern may produce a different comparison result than that produced by the initial comparison as represented by FIGS. 1–3. The illustrated bit values of data pattern 26 are intended to be representative of a statistically random number, and it should be understood that the individual FIG. 4 illustrated bits may not actually represent a statistically random number prepared from a known algorithm. The same number of bits are contained in FIGS. 3 and 4 example.

Figure 5:
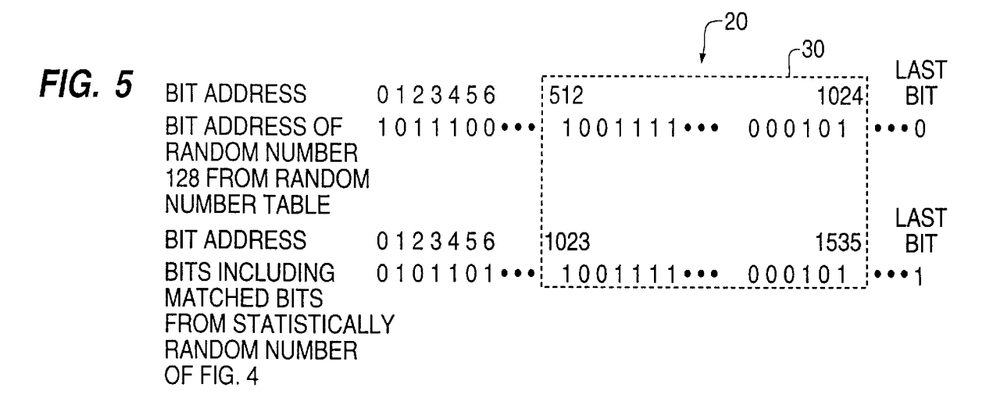
FIG. 5 illustrates an example matching of the statistically random number of FIG. 4 with the random number of the random number table of FIG. 1 having the highest number of sequential matched bits.

FIG. 5 illustrates another comparison process after the initial comparison process of FIG. 2, in which one number 12 from the random number table 10 having the largest number of sequential matched bits is again matched with corresponding sequential bits in the random number of FIG. 4. The matched number is number 128. The FIG. 5 dashed rectangle 30 illustrates a bit match in random number 128 between bits 512 and 1024, corresponding to bits 1023–1535 of the FIG. 4 statistically random number.

Figure 6:
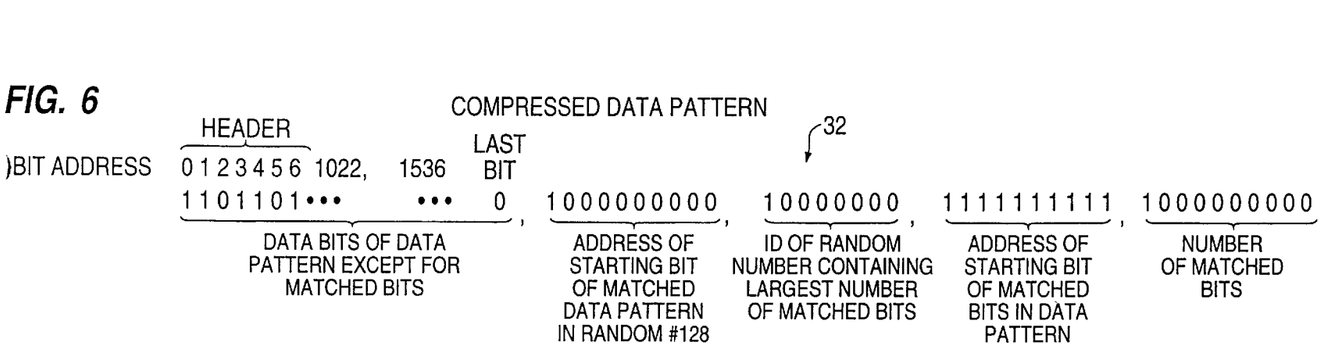
FIG. 6 illustrates an example storage field of the compressed pattern resultant from the matching process of FIG. 5.

FIG. 6 illustrates the compressed data pattern which is produced after the matched bits between 1023 and 1535 have been deleted and replaced with corresponding four types of information like those utilized in FIG. 3 to achieve data compression. The first type of information is the address of the starting bit of the matched data pattern in random number 128 which is address 512, which is encoded as binary pattern 1000000000. The second type of information is the identification of the random number containing the largest number of matched bits, which is the number 128, which is encoded as binary pattern 10000000. The third type of information is the address of the starting bit of the matched bits in the subject data pattern which is number 1023, which is encoded as binary pattern 1111111111. The last type of information is the number of matched bits which is the number 512, which is encoded as binary pattern 1000000000. Again the header is used to encode that the record is not all raw data by the first bit being a one. The same compression criteria may be used for encoding the data pattern 32 of FIG. 6 as was used in FIG. 3, namely that the number of matched bits which are deleted from the statistically random number 26 of FIG. 4 should be greater than the number of bits required to encode the four types of information which are recorded in the data pattern 32 of the compressed data pattern.

As illustrated, the process of FIGS. 4–6 may be repeated iteratively as long as the cumulative net result of the compressions produces a group of compressed data patterns 32 requiring fewer total bits to encode the four types of information, than the matched/deleted bits. Again individual compression steps may result in no net compression. Each time a new compressed data pattern is produced in accordance with FIG. 6, it may be transformed with the aforementioned random number generation process to become a statistically random number in accordance with FIG. 4, which thereafter is compressed by matching with the random numbers 12 in the random number table 10. This process for large data patterns 18 is typically repeated hundreds, thousands, or even a greater number of times, with the net result of the iterations producing further compression of data with each new data pattern 32 being stored.

The reproduction (decompression) of the data bits starts from the last most highly compressed data pattern 32 (which typically is stored in a storage medium such as a compact disc), and is the reverse of the data compression process of FIGS. 1–6. More specifically, the known candidate data pattern table and the decompression information (including the compression indicator bit(s), transformation indicator bit(s), first information (e.g., a first field), second information (e.g., a second field), third information (e.g., a third field) and fourth information (e.g., a fourth field)) may be utilized to decompress back to the original subject data pattern. More specifically, first the compression indicator bit is checked to see whether a subject decompression data pattern under analysis represents a compressed data pattern or a fully decompressed data pattern, and the transformation indicator bit is checked to see whether the subject decompression data pattern requires detransformation (e.g., de-randomizing). If a compressed data pattern is indicated, any necessary detransformation process is applied, and then the known candidate data pattern table and the first through fourth informations (fields) are utilized to determine the deleted data pattern bits, and where such deleted data pattern bits should be reinserted into the subject data pattern. Such processes are repeated until the compression indicator bit indicates that a fully decompressed data pattern has been obtained. That is, the decompression process in reverse order to the compression process expands each successive compressed data pattern until the original data pattern is again reproduced.

Figure 7:
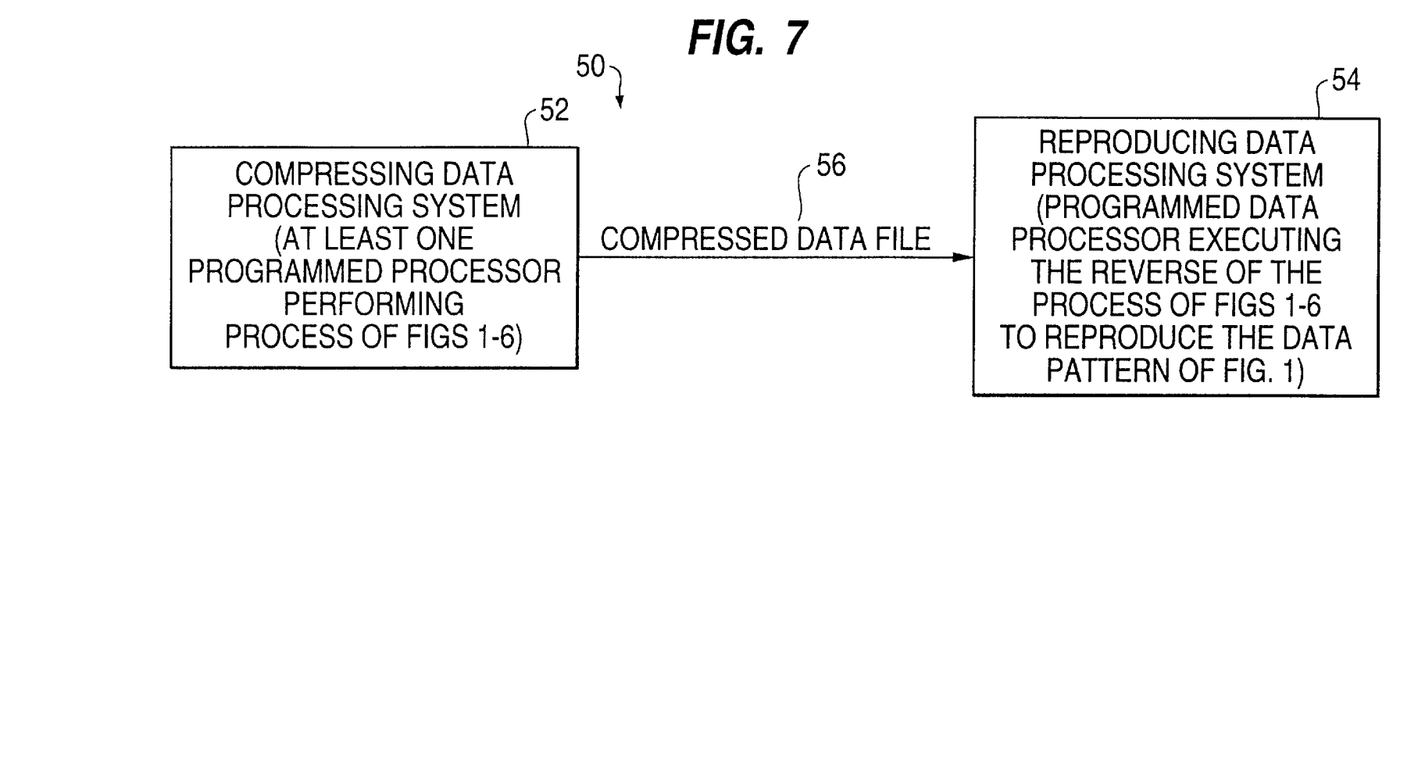
FIG. 7 is an example block diagram of one possible form of a system in which the present invention is practiced.

FIG. 7 illustrates a block diagram of a data processing system which may be used to practice the present invention. The system 50 is comprised of two processing systems, which are a compressing data processing system 52 and a reproducing data processing system 54. The compressing data processing system 52 and decompressing data processing system 54, each have at least one programmed processor performing the compression or decompression processes (e.g., such as those of FIGS. 1–6), whereas parallel processors may perform such processing faster. The resultant compressed data file 56, which may be recorded to and then retrieved from a compact disk or other storage medium, is loaded into the memory of the reproducing data processing system 54 which performs the reverse of the compression processes performed by the data processing system 52. It should be understood that the relative processing power of the systems 52 and 54 requires the compressing data processing system 52 to have much higher processing capability because of the required number of data matching operations 30 which are required in comparison to the reproduction of the compressed data which does not require any matching. Further, the data processing system 54 must know the predetermined format and compression processes used by the data processing system 52 in compressing to the compressed data file 56, as well as know/use the same random number table 10 and random numbers 12. Such information, again, may be encoded into the compressed data pattern. Alternatively, some of such information may be provided via a different means of transport, e.g., via modem, internet communications.

Turning now to an overview and more general discussions, embodiments of the present invention use comparison of a subject data pattern (e.g., 18 in FIG. 1) with a number of candidate numbers (e.g., 12 in FIG. 1), and achieves data compression by matching large numbers of sequential bits of a subject data pattern with large numbers of candidate bits contained in one of the candidate numbers. The matched data bits are deleted from the data pattern, and information (e.g., information bits) is added to the remaining data pattern, i.e., information allowing reverse analysis and decompression of the deleted bits. Compression operations may be repeatedly performed any (e.g., a predetermined) number of times, in an attempt to repeatedly compress the subject data pattern to a smaller and smaller size. Alternatively, such operations may be repeatedly performed until a predetermined situation is encountered.

For example, eventually one of the repeated compression attempts will reach a situation where a volume of information (e.g., information bits) to facilitate decompression, becomes equal to or greater than a number of subject bits being deleted. Clearly, such compression attempt does not realize improved compression, i.e., the number of added information bits must be less than the number of matched/deleted subject bits in order for the process to provide improved compression. Such situation may be handled in a number of different ways. For example, the non-improving compression attempt can be discarded, and the compression operations can be taken as being finished with the immediately preceding compression attempt. However, while one particular compression attempt may not result in improved compression, subsequent compression attempts (especially after subject data pattern and/or candidate data pattern transformation discussed previously) may yield significant further compression. Accordingly, as an alternative, any singular or predetermined number of non-improving compression attempts may be ignored, and further compression attempts may be made, i.e., in hopes that further compression may be obtained. As a number of subject data pattern bits approaches (e.g., equals) a number of information bits, further significant compression may not be able to be obtained.

The candidate numbers can be any predetermined numbers and may be generated by any known random or pseudo random number generating technique, including auto generated polynomials. In one example embodiment, a predetermined number of $2^N$ (where N is an integer) candidate numbers may be contained in a candidate number table (e.g., 10 in FIG. 1), while each candidate number may have $2^M$ (where M is an integer) number of candidate bits. Having a large number of candidate numbers, each having a large number of candidate bits, increases the potential that a significant match may be found between a large number of subject bits and a large number of candidate bits of one of the available candidate numbers. Practice of the present invention is not limited in any way to either the number of candidate numbers in the candidate number table, or the number of bits in each candidate number. In fact, as processing speeds become faster with future processing technology developments, larger numbers of candidate numbers having larger numbers of candidate bits may be used. Further, as processing speeds become faster, it may someday be feasible to apply the present invention to a non-binary subject data pattern using comparison of non-binary candidate patterns, e.g., attempting to match large strings of subject alphanumeric characters with large strings of candidate alphanumeric characters.

Turning now to further alternatives, comprehensive comparison or only partial comparison (with candidate numbers) may be performed. More particularly, in one example embodiment, comprehensive candidate comparison may be performed in that all the subject bits of the subject data may be compared with the candidate bits of all of the candidate numbers in the candidate number table, before an optimum match is decided, i.e., all possible matches may be investigated before it is determined which match represents the largest number of subject bits which can be matched. Such approach is advantageous because it tends to maximize the amount of compression obtained. In another embodiment, a partial candidate comparison may be attempted as it is not required that all of the numbers be used for comparison. For example, the comparison process may be stopped at a point when a match of a predetermined number of bits is obtained, i.e., even if comparison of all of the candidate bits/numbers in the candidate number table has not been made. Stopping of the comparison process after matching of a predetermined number of bits is advantageous in that processing time is attempted to be limited or minimized, but also is disadvantageous in that maximum compression might not be achieved.

Turning now to further discussion of the decompression information which is added to the subject data pattern after matching/deletion of bits, the compression indicator bit may be watched/used as an indicator of whether decompression is complete, and a decompression process can be repeatedly performed until the predetermined indicator bit changes back to the first logical value. This approach may be disadvantageous in that a processing error may change the compression indicator bit back to the first logical value, thus prematurely ending decompression processing and resulting in an erroneous decompressed data pattern. Alternatively, a plurality of compression indicator bits may be used to provide more complex information. For example a predetermined number of compression indicator bits may start at a predetermined number (e.g., zero) and be used to count up the number of compression operations which have been applied, and then may be used to count down the number of decompression operations until the predetermined starting number is returned. Any processing error could more readily be caught by monitoring/watching the compression indicator bits for proper count-up or count-down.

While the above example described predetermined transformation (i.e., randomization) of the compressed data pattern being applied after each compression, predetermined transformation may alternatively be applied at less frequent times. For example, a subject data pattern may be repeatedly compressed without transformation (i.e., randomization), and when a predetermined number of non-improving compression attempts is encountered, the resultant compressed data pattern may then be subjected to predetermined transformation to convert it into another data pattern. Thereafter, the aforementioned matching process involving the candidate number table is repeated as many times as the net end result of each matching process continues to produce a further compressed data pattern. The transformation process may be repeated iteratively as long as the net trend in the compressed data pattern is improved. If after several attempts of comparison with the candidate number table and transformation do not produce further compression, then the compression process may be considered complete.

Although not illustrated in the FIGS. 3–6 example, if transformation of subject data pattern is performed, then the decompression information must additionally contain detransformation information instructing detransformation during the decompression operation. Such detransformation information may be a simple predetermined detransformation indicator bit (e.g., the second bit) used to designate whether a subject data pattern is a transformed (e.g., randomized) data pattern. That is, a first logical value (e.g., zero) may be used within such indicator bit to encode that the data pattern is a transformed data pattern, while an opposite logical value (e.g., one) may be used within such indicator bit to encode that the data pattern is not a transformed data pattern. Accordingly, such indicator bit may be watched/used as an indicator during decompression to determine whether detransformation is required with respect to a subject decompression data pattern. Alternatively, a plurality of detransformation indicator bits may be used to provide more complex information. For example a predetermined number of compression indicator bits may be used to not only indicate that detransformation is required with respect to a subject decompression data pattern, but may also be used to identify which particular detransformation algorithm which should be used.

While the subject data pattern has been described as possibly undergoing transformation (e.g., randomization), it may likewise be beneficial to change tables 10 or transform the candidate numbers within the candidate number table 10 after any compression stage, e.g., such might provide some degree of encryption protection. If a table change or candidate number transformation is performed after any compression stage, then suitable table or candidate number information may be added to the compressed data pattern to instruct corresponding table change or candidate number detransformation during decompression. As one example, a number of differing candidate tables may be mutually known by the compressing system and decompressing systems, and rotated through at predetermined timings or indications.

After compression is complete, a highly compressed data record may be transmitted or stored on a much smaller data storage medium than the original data pattern. Degrees of compression which may be obtained with embodiments of the present invention represent a compression of more than 100:1. In addition, embodiments of the present invention can be combined with other known compression processes to accumulate and/or multiply the degree of compression. For example, a known compression process can be first applied to achieve a 5:1 degree of compression, and then an embodiment of the present invention can be applied to the result to achieve a further 100:1 degree of compression, thus resulting in an overall 500:1 degree of compression. However, embodiments of the present invention are not limited to such degrees of compression, or being used as a subsequent compression process, i.e., the compression embodiments/processes can be applied at any compression stage, including a first compression stage.

The high data compression achieved with the present invention has substantial practical application. As but one example, a picture image of 600×800×256 (460 KB) resolution could be compressed down to less than 1 KB. This degree of compression could also make a 56 KB modem the equivalent bandwidth of 2.8 MB/sec., if sufficient processor power exists for compression and decompression. A further example is the recording and reproduction of data patterns, such as movies and audio records which when digitized contain tremendous quantities of data.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art. It is intended that all such modifications fall within the scope of the appended claims.

What is claimed is:

1. A process for compressing a subject data pattern of data bits with a data processing system, comprising:
   (a) providing a group of candidate numbers with each number comprising a sequence of bits;
   (b) comparing with the data processing system, the subject data pattern with at least some portions of the group of candidate numbers to match a sequence of bits of the subject data pattern and a largest sequence of bits within the compared portions of the group of candidate numbers; and
   (c) storing all of the data pattern except the matched bits, and information identifying the matched bits within the group of candidate numbers.

2. A process for compressing with a data processing system a data pattern of data bits stored in a storage medium comprising:
   (a) providing a group of numbers from the storage medium with each number comprising a sequence of statistically random bits;
   (b) comparing with the data processing system the data pattern with at least some of the group of numbers to match a sequence of bits of the data pattern and a largest sequence of bits within any one of the group of numbers; and
   (c) storing all of the data pattern except the matched bits, an identification of the one number, locations of the matched bits in the data pattern and in the one number and a number encoding a number of the matched bits.

3. A process in accordance with claim 2 wherein:
   step (c) is performed only when a total number of bits in the data pattern exclusive of the matched bits, bits required to encode the locations of the matched bits in the data pattern and in the one number and bits required to encode a number representing a number of the matched bits is less than a total number of bits in the data pattern.

4. A process in accordance with claim 3 wherein:
   the locations of the matched bits are encoded as a first bit within the matched bits as determined relative to a first bit in the data pattern.

5. A process in accordance with claim 3 wherein:
   (d) the stored result of step (c) is processed to generate a statistically random data pattern of bits therefrom;
   (e) the statistically random data pattern is compared with each of the group of numbers to match a sequence of bits of the statistically random data pattern with a largest sequence of bits within any one of the group of numbers; and
   (f) storing all of the statistically random data pattern produced by step (d) except the matched bits, an identification of the one number, locations of the matched bits in the statistically random data pattern and in the one number and a number encoding a number of the matched bits.

6. A process in accordance with claim 5 wherein:
   step (f) is performed only when a total number of bits in the statistically random data pattern exclusive of the matched bits, an identification of the one number, bits required to encode locations of the matched bits in the statistically random data pattern and in the one number and bits required to identify a number of the matched bits is less than a total of bits in the statistically random data pattern.

7. A process in accordance with claim 6 further comprising:
   (g) the result of step (f) is encoded to generate another statistically random data pattern of bits therefrom;
   (h) comparing the another statistically random data pattern of bits produced by step (g) to match a sequence of bits in the another statistically random data pattern of bits and a largest sequence of bits within any one of the group of numbers; and
   (i) storing all of the another statistically random data pattern produced by step (g) except the matched bits, an identification of the one number of step (h) locations of the matched bits in the another statistically random data pattern and in the one number of step (h) and a number identifying a number of the matched bits when a total number of bits in the another statistically random data pattern produced by step (g) exclusive of the matched bits, bits required to encode locations of the matched bits in the another statistically random data pattern and in the one number of step (h) and bits required to encode the number of matched bits is less than a total number of bits in the another statistically random data pattern produced by step (g).

8. A process in accordance with claim 7 further comprising repeating steps (g), (h) and (i) until step (i) cannot be completed because the total number of bits is not less than a total number of bits in the another statistically random data pattern produced by step (g).

9. A process in accordance with claim 3 wherein a stored result produced by step (c) is processed to reproduce the data pattern comprising the steps:
- (a) processing the stored result of step (c) to identify the matched bits within the one number from the stored location of the matched bits in the one number and the stored number representing the number of matched bits; and
- (b) inserting the matched bits in the data pattern at the stored location of the matched bits in the data pattern.

10. A process in accordance with claim 6 wherein a result produced by step (f) is processed to reproduce the statistically random data pattern comprising the steps:
- (a) processing the stored result of step (f) to identify the matched bits within the one number from the stored location of the bits in the one number and the stored number representing the number of matched bits; and
- (b) inserting the matched bits in the statistically random data pattern at the stored location of the bits in the statistically random data pattern.

11. A process in accordance with claim 7 wherein the result of step (i) is processed to reproduce the another statistically random data pattern comprising the steps:
- (a) processing the stored result of step (i) to identify the matched bits within the one number from the stored location of the matched bits in the one number and the stored number representing the number of matched bits; and
- (b) inserting the matched bits in the another statistically random data pattern at the stored location of the bits in the statistically random data pattern.

12. A process in accordance with claim 8 wherein the result of step (i) is processed to reproduce the another statistically random data pattern comprising the steps:
- (a) processing the stored result of step (i) to identify the matched bits within the one number from the stored location of the matched bits in the one number and the stored number representing the number of matched bits; and
- (b) inserting the matched bits in the another statistically random data pattern at the stored location of the bits in the statistically random data pattern.

13. A record stored in a storage medium which is processed by a processor to reproduce a data pattern therefrom comprising:
- a data field containing a plurality of data bits representing all data bits of the data pattern except for a matched sequence of data bits, a location of the matched sequence of data bits in the data pattern, a number identifying a number of bits in the matched sequence of data bits and a location where a sequence of a largest number of data bits identical to the matched sequence of data bits is located in one number of at least some of a group of numbers each containing a sequence of bits which are statistically random and an identification of the one number.

14. A record in accordance with claim 13 further comprising:
- another data field, containing a plurality of data bits representing all bits of a data pattern produced from processing the data field to generate a statistically random data pattern therefrom except for another matched sequence of data bits, a location of the matched sequence of data bits in the statistically random data pattern, the number identifying the number of bits in the another matched sequence of bits, a location where a sequence of a largest number of data bits identical to the another matched sequence of data bits is located in one number of the group of numbers, and an identification of the one number in the another data field.

15. A record in accordance with claim 14 further comprising:
- at least one additional data field, each additional data field containing a plurality of data bits representing all bits of a data pattern produced from processing one of the data field or an additional data field to generate another statistically random data pattern therefrom except for another matched sequence of data bits, a location of the matched sequence of data bits in the another statistically random data pattern, the number identifying the number of bits in the another matched sequence of bits, a location where sequence of a largest number of data bits identical to the another matched sequence of data bits is located in one number of the group of numbers, and an identification of the one number in the at least one additional data field.

16. A data processing system comprising:
- a processing unit and a memory coupled to the processing unit for storing of information used by the processing unit, the processing unit
  - (a) providing a group of numbers with each number comprising a sequence of statistically random bits;
  - (b) comparing the data pattern with at least some of the group of numbers to match a sequence of bits of the data pattern and a largest sequence of bits within any one of the group of numbers; and
  - (c) storing all of the data pattern in the memory except the matched bits, locations of the matched bits in the data pattern and in the one number, a number encoding a number of the matched bits and an identification of the one number.

17. A data processing system in accordance with claim 16 wherein the processing unit:
- performs step (c) only when a total number of bits in the data pattern exclusive of the matched bits, bits required to encode the locations of the matched bits in the data pattern and in the one number and bits required to encode a number representing a number of the matched bits and bits required to encode an identification of the one number are less than a total number of bits in the data pattern.

18. A data processing system in accordance with claim 17 wherein the processing unit:
- encodes the locations of the matched bits as a first bit within the matched bits as determined relative to a first bit in the data pattern.

19. A data processing system in accordance with claim 18 wherein the processing unit:
- (d) processes the stored result of step (c) to generate a statistically random data pattern of bits therefrom;
- (e) compares the statistically random data pattern with each of the group of numbers to match a sequence of bits of the statistically random data pattern with a largest sequence of bits within any one of the group of numbers; and
- (f) stores all of the statistically random data pattern produced by step (d) except the matched bits, locations of the matched bits in the statistically random data pattern and in the one number, a number encoding a number of the matched bits and an identification of the one number.

20. A data processing system in accordance with claim 19 wherein the processing unit:

performs step (f) only when a total number of bits in the statistically random data pattern exclusive of the matched bits, bits required to encode locations of the matched bits in the statistically random data pattern and in the one number, bits required to identify a number of the matched bits and an identification of the one number are less than a total of bits in the statistically random data pattern.

21. A data processing system in accordance with claim 20 wherein the processing unit:

(g) encodes the result of step (f) to generate another statistically random data pattern of bits therefrom;

(h) compares the another statistically random data pattern of bits produced by step (g) to match a sequence of bits in the another statistically random data pattern of bits and a largest sequence of bits within any one of the group of numbers; and (i) causes the memory to store all of the another statistically random data pattern produced by step (g) except the matched bits, locations of the matched bits in the another statistically random data pattern and in the one number of step (h) and a number identifying a number of the matched bits when a total number of bits in the another statistically random data pattern produced by step (g) exclusive of the matched bits, bits required to encode locations of the matched bits in the another statistically random data pattern and in the one number of step (h), bits required to encode the number of matched bits and an identification of the one number of step (h) are less than a total number of bits in the another statistically random data pattern produced by step (g).

22. A data processing system in accordance with claim 21 wherein the processing unit:

repeats steps (g), (h) and (i) until step (i) cannot be completed because the total number of bits is not less than a total number of bits in the another statistically random data pattern produced by step (g).

23. A data processing system in accordance with claim 17 wherein:

the data processing system comprises another processing unit and another memory coupled to the processing unit for reproducing the stored result and wherein the another processing unit (a) processes the stored result of step (c) to identify the matched bits within the one number from the stored location of the matched bits in the one number and the stored number representing the number of matched bits; and (b) inserts the matched bits in the data pattern at the stored location of the matched bits in the data pattern.

24. A data processing system in accordance with claim 20 wherein the another processing unit:

(a) processes the stored result of step (f) to identify the matched bits within the one number from the stored location of the bits in the one number and the stored number representing the number of matched bits; and (b) inserts the matched bits in the statistically random data pattern at the stored location of the bits in the statistically random data pattern.

25. A data processing system in accordance with claim 21 wherein the another processing unit:

(a) processes the stored result of step (i) to identify the matched bits within the one number from the stored location of the matched bits in the one number and the stored number representing the number of matched bits; and (b) inserts the matched bits in the another statistically random data pattern at the stored location of the bits in the statistically random data pattern.

26. A data processing system in accordance with claim 22 wherein the another processing unit:

(a) processes the stored result of step (i) to identify the matched bits within the one number from the stored location of the matched bits in the one number and the stored number representing the number of matched bits; and (b) inserts the matched bits in the another statistically random data pattern at the stored location of the bits in the statistically random data pattern.

27. A computer program stored in a tangible medium for compressing with a data processing system a data pattern of data bits stored in a storage medium, the program performing the steps comprising:

(a) providing a group of numbers from the storage medium with each number comprising a sequence of statistically random bits;

(b) comparing with the data processing system the data pattern with at least some of the group of numbers to match a sequence of bits of the data pattern and a largest sequence of bits within any one of the group of numbers; and (c) storing all of the data pattern except the matched bits, an identification of the one number, locations of the matched bits in the data pattern and in the one number and a number encoding a number of the matched bits.

* * * * *